United States Patent
Ding et al.

(10) Patent No.: US 9,620,264 B2
(45) Date of Patent: Apr. 11, 2017

(54) METHOD FOR MANUFACTURING TRANSPARENT CONDUCTIVE FILM

(71) Applicant: XI'AN JIAOTONG UNIVERSITY, Xi'an (CN)

(72) Inventors: Yucheng Ding, Xi'an (CN); Jinyou Shao, Xi'an (CN); Xiangming Li, Xi'an (CN); Hongmiao Tian, Xi'an (CN); Xin Li, Xi'an (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 94 days.

(21) Appl. No.: 14/631,824

(22) Filed: Feb. 25, 2015

(65) Prior Publication Data

US 2015/0170802 A1    Jun. 18, 2015

Related U.S. Application Data

(63) Continuation-in-part of application No. PCT/CN2014/070857, filed on Jan. 18, 2014.

(30) Foreign Application Priority Data

May 7, 2013    (CN) .......................... 2013 1 0165411

(51) Int. Cl.
| | |
|---|---|
| *B05D 3/06* | (2006.01) |
| *H01B 13/32* | (2006.01) |
| *G06F 3/041* | (2006.01) |
| *B05D 1/40* | (2006.01) |
| *B05D 3/14* | (2006.01) |

(52) U.S. Cl.
CPC ............ *H01B 13/323* (2013.01); *B05D 1/40* (2013.01); *B05D 3/14* (2013.01); *G06F 3/041* (2013.01); *G06F 2203/04103* (2013.01)

(58) Field of Classification Search
CPC .......... H01B 13/323; B05D 1/40; B05D 3/14; G06F 3/041
See application file for complete search history.

(56) References Cited

FOREIGN PATENT DOCUMENTS

CN    103337300 A  *  10/2013    ............. G06F 3/041

* cited by examiner

*Primary Examiner* — Michael Wieczorek
(74) *Attorney, Agent, or Firm* — Matthias Scholl, PC; Matthias Scholl

(57) ABSTRACT

A method for manufacturing a transparent conductive film, including: 1) providing a conductive scraper including a slurry feeding mouth and a slurry discharging gap; 2) placing a transparent film including a prefabricated groove on a conductive moving table, moving the conductive moving table horizontally in relation to the conductive scraper, controlling the moving speed of the conductive moving table at between 0.1 and 1 m/min, and allowing the conductive slurry to flow out of the conductive scrapper via the slurry discharging gap; 3) applying a voltage between the conductive moving table and the conductive scraper, and driving the conductive slurry flowing out of the conductive scraper to fill the groove of the transparent film by an electrodynamic force produced by the voltage; and 4) curing the conductive slurry filled in the groove of the transparent film.

4 Claims, 2 Drawing Sheets

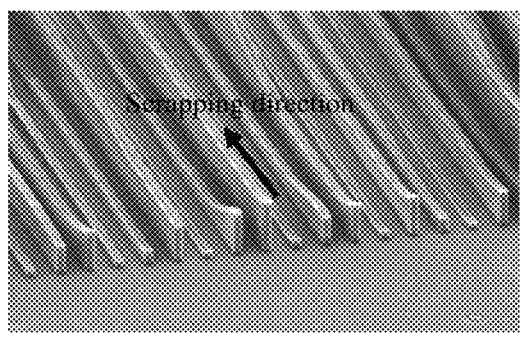 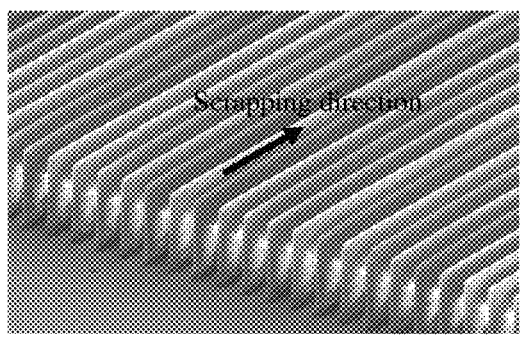
FIG. 3A    FIG. 3B
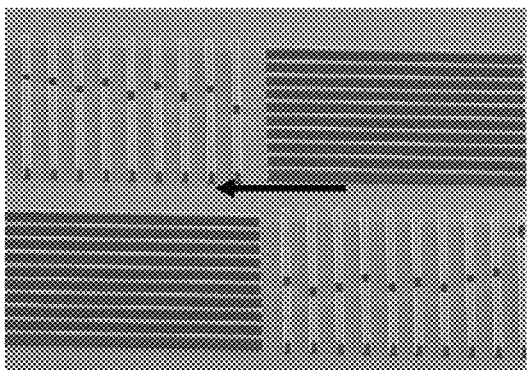 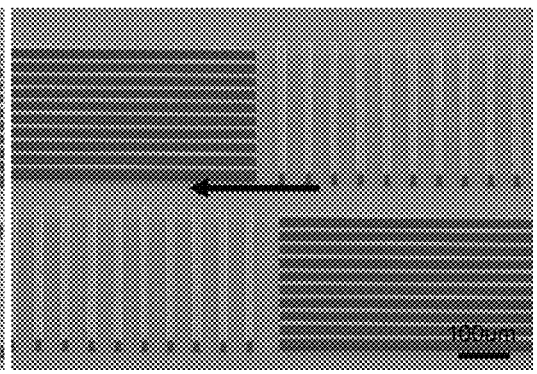
FIG. 4A    FIG. 4B

METHOD FOR MANUFACTURING TRANSPARENT CONDUCTIVE FILM

CROSS-REFERENCE TO RELATED APPLICATIONS

This application is a continuation-in-part of International Patent Application No. PCT/CN2014/070857 with an international filing date of Jan. 18, 2014, designating the United States, now pending, and further claims priority benefits to Chinese Patent Application No. 201310165411.1 filed May 7, 2013. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

The invention relates to the field of micro-fabrication technology, and more particularly to a method for manufacturing a transparent conductive film.

Description of the Related Art

A typical method for manufacturing a transparent conductive film includes manufacturing a conductive foil circuit on the surface of a transparent film substrate, for example, manufacturing a tin indium oxide (ITO) circuit by coating and etching processes. However, fissures easily occur on the circuit or the circuit is easily separated from the surface of the transparent film substrate, particularly in flexible display device.

Another typical method for manufacturing the transparent conductive film adopts scrapping. A conductive slurry (a liquid phase or a compound having high rheology containing different low-dimensional conductive materials) is filled in a prefabricated groove in the transparent film and is then cured, sintered, and polished to form an inlaid circuit on the transparent film. However, in large area scrapping-filling process, to reduce defects resulting from uneven depth or entrapment of air bubbles, the scrapping is often conducted at low scrapping speed, which reduces the production efficiency and makes it difficult to ensure the quality of the inlaid circuit on the surface of the large area substrate.

SUMMARY OF THE INVENTION

In view of the above-described problems, it is one objective of the invention to provide a method for manufacturing a transparent conductive film. The method is based on the principle of electric hydrodynamics, different liquid phase conductive slurry (for example, a liquid phase or a compound of high rheology formed by a mixture of different low dimensional nanomaterials) can be quickly and evenly filled into prefabricated grooves of a micron or even nano scale on a transparent film driven by an electric force and a scrapper. The grooves of the micron or nano scale are made using different commercialize imprint technology. The filling effect of the conductive slurry is not impacted by the shape of the opening, the direction, or the depth of the grooves or the moving direction of the scrapper, so that the production efficiency, the quality and the uniformity of large area substrate of the transparent conductive film are largely improved.

To achieve the above objective, in accordance with one embodiment of the invention, there is provided a method for manufacturing a transparent conductive film. The method comprises the following steps:

1) providing a conductive scraper, the conductive scraper comprising a slurry feeding mouth and a slurry discharging gap, and employing the conductive scraper as a channel for introducing a conductive slurry and as an electrode;
2) placing a transparent film comprising a prefabricated groove on a conductive moving table, moving the conductive moving table horizontally in relation to the conductive scraper, controlling a moving speed of the conductive moving table at between 0.1 and 1 m/min, and allowing the conductive slurry to flow out of the conductive scrapper via the slurry discharging gap thereof;
3) applying a voltage between the conductive moving table and the conductive scraper, controlling an average electric field strength between the conductive scraper and the conductive moving table at between 50 and 5000 V/mm; and driving the conductive slurry flowing out of the conductive scraper to fill the groove of the transparent film by an electrodynamic force produced by the voltage; and
4) curing the conductive slurry filled in the groove of the transparent film, whereby obtaining a transparent conductive film.

In a class of this embodiment, the voltage in step 3) is a DC voltage or a low frequency AC voltage; and when the low frequency AC voltage is adopted, a frequency thereof is controlled at no more than 1 kHz.

In a class of this embodiment, the curing comprises: heating curing, ultraviolet light (UV) light curing, and volatile curing; and the curing mode is adopted according to a material quality of the conductive slurry.

In a class of this embodiment, the method further comprises performing sintering treatment and polishing treatment after 4) if necessary.

Advantages of the invention according to embodiments of the invention are as follows: the method of the invention is applicable for a wide range of liquid phase or a conductive slurry having high rheology, including a water suspensions or organic slurries synthesized by a different low-dimensional nanomaterials (such as nano metal particles or nano lines, or carbon nanotubes, or graphene). Based on the principle of electric hydrodynamics, the functional liquid material is filled into the prefabricated groove of the transparent film. Not only is the high filling efficiency realized, but also the defects of the air bubble entrapment or the uneven filling are avoided, thereby improving the quality and the yield of the circuit.

BRIEF DESCRIPTION OF THE DRAWINGS

The invention is described hereinbelow with reference to the accompanying drawings, in which:

FIG. 3A is a picture showing a filling effect obtained from a conventional scrapping method (in the absence of applying a voltage);

FIG. 3B is a picture showing a filling effect obtained from a scrapping method by applying a voltage of 200 V in accordance with one embodiment of the invention;

FIG. 4A is a picture showing uniformity of a conductive material produced from a conventional scrapping method; and FIG. 4B is a picture showing uniformity of a conductive material produced from a scrapping method by applying a voltage in accordance with one embodiment of the invention.

Figure 1:
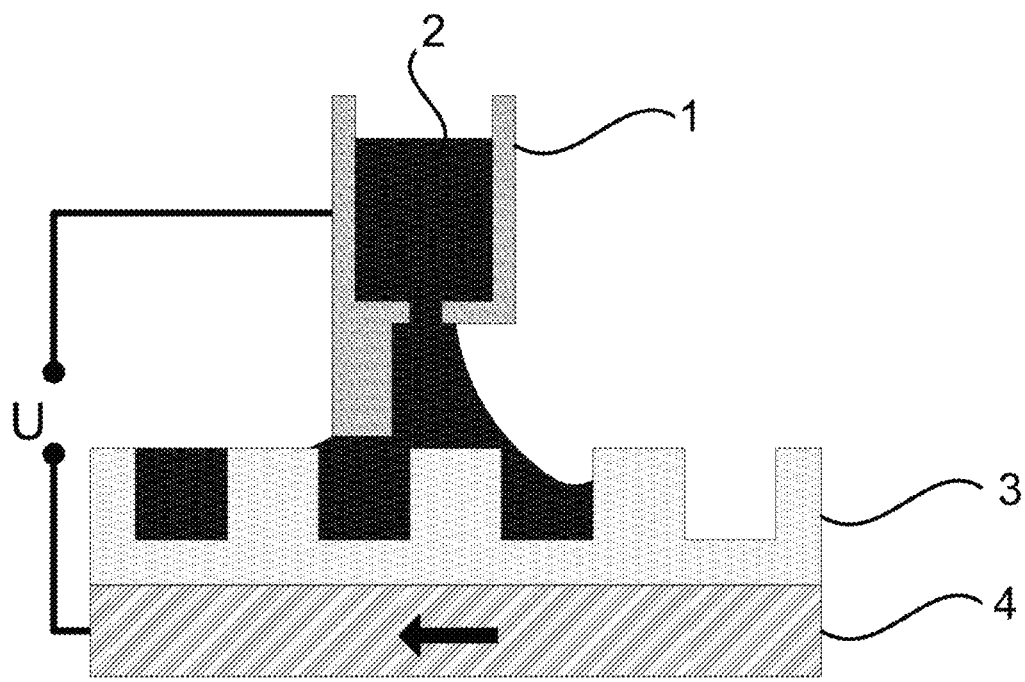
FIG. 1 is a schematic diagram showing a filling process of a transparent film with a conductive slurry driven by an electric field force in accordance with one embodiment of the invention.

In the drawings, the following reference numbers are used: 1. Conductive scraper; 2. Conductive slurry; 3. Transparent film comprising groove; and 4. Conductive moving table.

DETAILED DESCRIPTION OF THE EMBODIMENTS

For further illustrating the invention, experiments detailing a method for manufacturing a transparent conductive film are described below. It should be noted that the following examples are intended to describe and not to limit the invention.

Figure 2:
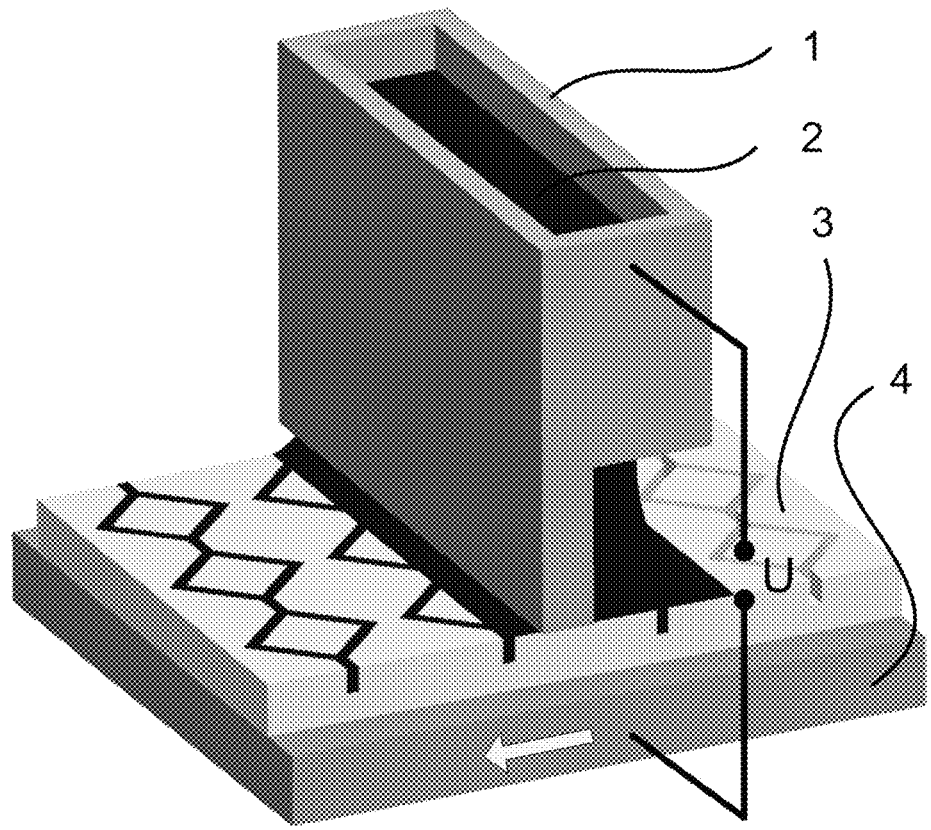
FIG. 2 is a filling device driven by an electric field force in accordance with one embodiment of the invention.

A method for manufacturing a transparent conductive film based on filling driven by an external electric field, the method comprises the following steps:

1) Preparation of a conductive scrapper 1: as shown in FIGS. 1-2, the conductive scrapper 1 comprises a slurry feeding mouth and a slurry discharging gap. The conductive scrapper 1 is used as a channel for introducing a conductive slurry 2 as well as an electrode.

2) Continuous feeding the conductive slurry: as shown in FIG. 2, a transparent film 3 comprising prefabricated grooves is disposed on a conductive moving table 4. The conductive moving table 4 is enabled to move horizontally in relation to the conductive scraper 1 at a moving speed of between 0.1 and 1 m/min. The conductive slurry 2 flows out of the conductive scrapper 1 via the slurry discharging gap thereof.

3) Electrodynamic filling: as shown in FIG. 2, a voltage is applied between the conductive moving table 4 and the conductive scraper 1, and an average electric field strength between the conductive scraper 1 and the conductive moving table 4 is controlled at between 50 and 5000 V/mm The voltage herein is a DC voltage or a low frequency AC voltage. When the low frequency AC voltage is adopted, a frequency thereof is controlled at no more than 1 kHz. The conductive slurry 2 flowing out of the conductive scraper 1 is driven by an electrodynamic force produced by the voltage to fill the grooves of the transparent film 3.

4) Curing the conductive slurry filled in the grooves of the transparent film: curing methods are adopted according to differences in material qualities of different conductive slurries. The curing method comprises: heating curing, ultraviolet light (UV) light curing, and volatile curing. A transparent conductive film is acquired after the curing. Sintering treatment and polishing treatment are conducted subsequently if necessary.

EXAMPLE 1

To illustrate the superiority of the scrapping method adopting the electrodynamic force in the filling efficiency and the filing effect, a UV cured conductive material is used in this example. The UV cured conductive material is filled in the grooves of the transparent film, and a UV light is used to cure the conductive material. The conductive material is then separated from the grooves of the transparent film. The advantage of the filling driven by the external electric filed is evaluated by observation of an integrity of the microstructure of the separated conductive material. Comparisons of the filling efficiencies are made between conventional method and the present method using the external electric field. FIG. 3A is a picture showing a filling effect obtained from the conventional method (in the absence of applying any voltage). FIG. 3B is a picture showing the filling effect obtained from the present method by applying a voltage of 200 V. Both the methods are conducted at a scrapping speed of 0.5 mm/min. It is known from the comparison that the liquid material is more easily filled into the grooves of the transparent film under the condition of applying a voltage.

EXAMPLE 2

Because directions of the grooves of the transparent film are variable in practical operation, filling effects of grooves in different directions are distinct from one another by adopting the conventional filling method. As shown in FIG. 4A, in the conventional scrapping filling method, when the grooves are mutually perpendicularly arranged, the grooves arranged in a direction parallel to the scrapping direction are prone to be filled, whereas the grooves arranged in the direction perpendicular to the scrapping direction are often entrapped with air bubbles. As shown in FIG. 4B, in the filling method driven by the external electric field of the invention, the mutually perpendicular grooves can be completely filled. In practical industrial application, in order to prevent the entrapment of the air bubbles, the conventional scrapping process often requires to reduce the scrapping speed of the scrapper, which largely affects the production efficiency. The method of the invention adopts the electrodynamics effect produced by the external electric field, which is adapted to avoid the defects of the entrapment of the air bubbles to a large degree and enable the scrapper to move at a higher scrapping speed, thereby improving the production efficiency.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for manufacturing a transparent conductive film, the method comprising:
   1) providing a conductive scraper, the conductive scraper comprising a slurry feeding mouth and a slurry discharging gap, and employing the conductive scraper as a channel for introducing a conductive slurry and as an electrode;
   2) placing a transparent film comprising a prefabricated groove on a conductive moving table, moving the conductive moving table horizontally in relation to the conductive scraper, controlling a moving speed of the conductive moving table at between 0.1 and 1 m/min, and allowing the conductive slurry to flow out of the conductive scrapper via the slurry discharging gap thereof;
   3) applying a voltage between the conductive moving table and the conductive scraper, controlling an average electric field strength between the conductive scraper and the conductive moving table at between 50 and 5000 V/mm; and driving the conductive slurry flowing out of the conductive scraper to fill the groove of the transparent film by an electrodynamic force produced by the voltage; and 4) curing the conductive slurry filled in the groove of the transparent film, whereby obtaining a transparent conductive film.

2. The method of claim 1, wherein the voltage in 3) is a DC voltage or a low frequency AC voltage; and when the low frequency AC voltage is adopted, a frequency thereof is controlled at no more than 1 kHz.

3. The method of claim 1, wherein a curing mode in 4) comprises: heating curing, ultraviolet light (UV) light curing, and volatile curing; and the curing mode is adopted according to a material quality of the conductive slurry.

4. The method of claim 1, further comprising performing sintering treatment and polishing treatment after 4).

* * * * *